(12) United States Patent
Park

(10) Patent No.: US 9,257,160 B2
(45) Date of Patent: Feb. 9, 2016

(54) PRECHARGE CIRCUIT AND SEMICONDUCTOR MEMORY APPARATUS USING THE SAME

(71) Applicant: SK hynix Inc., Icheon-si Gyeonggi-do (KR)

(72) Inventor: Mun Phil Park, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/266,206

(22) Filed: Apr. 30, 2014

(65) Prior Publication Data

US 2015/0213856 A1     Jul. 30, 2015

(30) Foreign Application Priority Data

Jan. 28, 2014  (KR) .................. 10-2014-0010282

(51) Int. Cl.
*G11C 7/12* (2006.01)
*G11C 7/10* (2006.01)
*G11C 11/4076* (2006.01)

(52) U.S. Cl.
CPC .......... *G11C 7/1048* (2013.01); *G11C 11/4076* (2013.01); *G11C 2207/005* (2013.01)

(58) Field of Classification Search
CPC .................................................. G11C 7/1048

USPC ........................................................ 365/203
See application file for complete search history.

(56) References Cited

U.S. PATENT DOCUMENTS

| | | | |
|---|---|---|---|
| 6,034,884 A * | 3/2000 | Jung ............................. | 365/145 |
| 6,288,927 B1 * | 9/2001 | Inaba et al. ..................... | 365/63 |
| 6,333,881 B1 * | 12/2001 | Kusunoki et al. ............. | 365/203 |
| 6,577,530 B2 * | 6/2003 | Muranaka et al. ............. | 365/177 |
| 7,130,232 B2 * | 10/2006 | Kim et al. ..................... | 365/203 |
| 7,376,029 B2 * | 5/2008 | Jung et al. ..................... | 365/203 |
| 7,477,558 B2 * | 1/2009 | Lee et al. ...................... | 365/203 |
| 7,539,064 B2 * | 5/2009 | Lee .......................... | 365/185.24 |
| 8,400,855 B2 * | 3/2013 | Nakagawa et al. ........... | 365/203 |
| 8,559,254 B2 | 10/2013 | Kim | |
| 2006/0028888 A1 * | 2/2006 | Shin et al. ..................... | 365/205 |
| 2008/0130389 A1 * | 6/2008 | Kajitani ........................ | 365/203 |

* cited by examiner

*Primary Examiner* — Son Mai
(74) *Attorney, Agent, or Firm* — William Park & Associates Ltd.

(57) ABSTRACT

A precharge circuit may include a precharge control unit, a first precharge unit, and a second precharge unit. The precharge control unit may generate a read precharge signal and a write precharge signal in response to a read signal, a write signal, and a precharge signal. The first precharge unit may precharge a data input/output line to a first voltage level in response to the read precharge signal. The second precharge unit may precharge the data input/output line to either a second voltage level or a third voltage level in response to the write precharge signal.

16 Claims, 9 Drawing Sheets

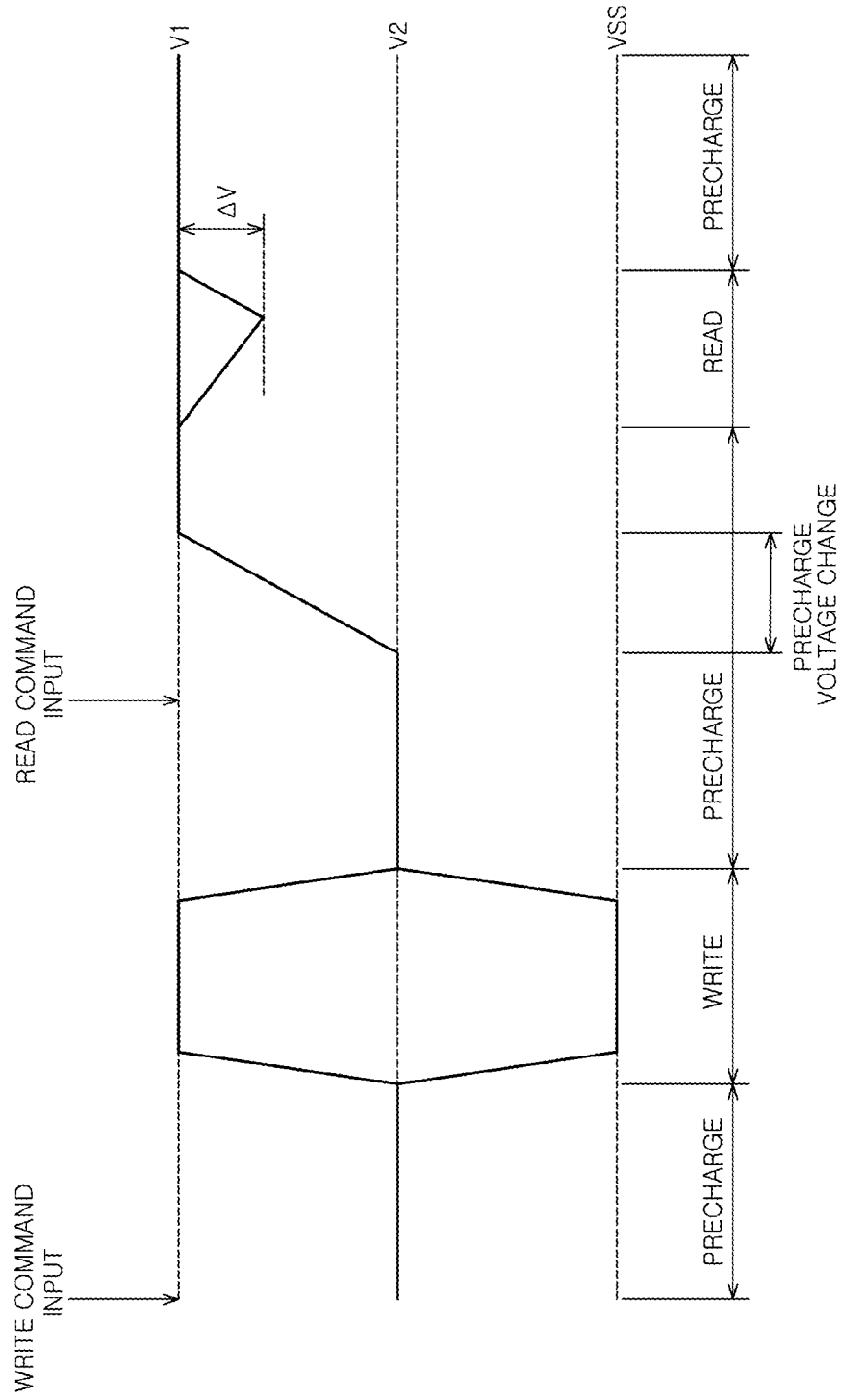

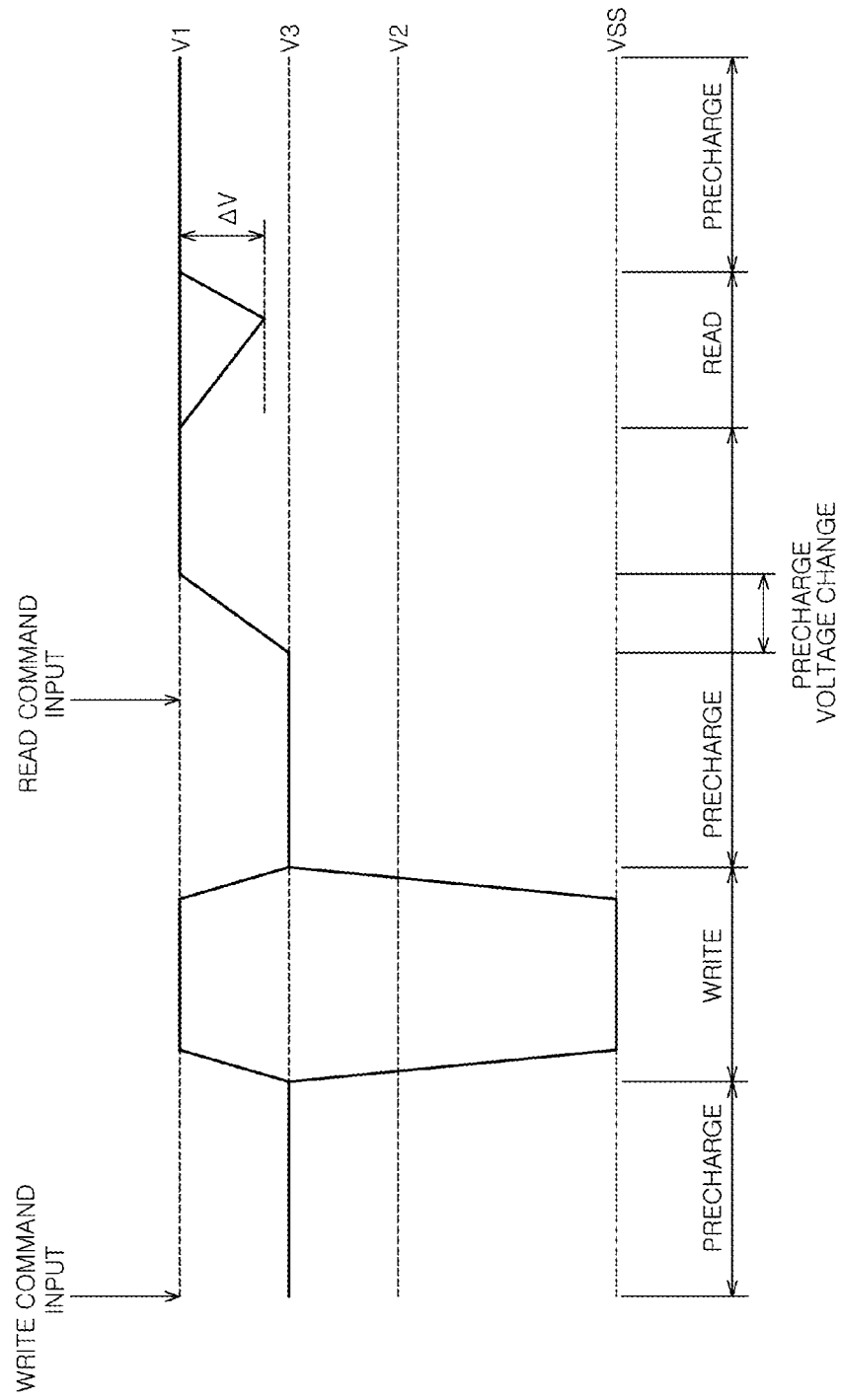

PRECHARGE CIRCUIT AND SEMICONDUCTOR MEMORY APPARATUS USING THE SAME

CROSS-REFERENCES TO RELATED APPLICATION

The present application claims priority under 35 U.S.C. §119(a) to Korean application number 10-2014-0010282, filed on Jan. 28, 2014 in the Korean Intellectual Property Office, which is incorporated herein by reference in its entirety as set forth in full.

BACKGROUND

1. Technical Field

Various embodiments generally relate to a memory apparatus, and more particularly, to a precharge circuit of the memory apparatus.

2. Related Art

In general a semiconductor memory apparatus performs data communication with a memory controller or a processor. The semiconductor memory apparatus includes a plurality of memory cells, and stores data transmitted from the memory controller or the processor into the plurality of memory cells. The semiconductor memory apparatus includes a lot of memory cells in order to store a large amount of data. However, there is limitation in a number of input/output lines to transfer data for high integration of the semiconductor memory apparatus, and therefore the semiconductor memory apparatus may adopt a hierarchical scheme of input/output lines.

SUMMARY

In an embodiment, a precharge circuit may include a precharge control unit configured to generate a read precharge signal and a write precharge signal in response to a read signal, a write signal, and a precharge signal. The precharge circuit may also include a first precharge unit configured to precharge a data input/output line to a first voltage level in response to the read precharge signal, and a second precharge unit configured to precharge the data input/output line to either a second voltage level or a third voltage level in response to the write precharge signal.

In an embodiment, a precharge circuit may include a precharge control unit configured to generate a read precharge signal and a write precharge signal in response to a write signal, a write end signal, and a precharge signal. The precharge circuit may also include a first precharge unit configured to precharge a data input/output line to a first voltage level in response to the read precharge signal, and a second precharge unit configured to precharge the data input/output line to either a second voltage level or a third voltage level in response to the write precharge signal.

In an embodiment, a semiconductor memory apparatus may include a first data input/output line configured to transfer data. The precharge circuit may be configured to precharge the first data input/output line to a first voltage level during a read operation, and to precharge the first data input/output line to either a second voltage level or a third voltage level during a write operation.

In an embodiment, a system may include: a processor; a chipset configured to couple with the processor; a memory controller configured to receive data provided from the processor through the chipset; and a memory device configured to receive the data from the memory controller and includes a semiconductor memory apparatus, the semiconductor memory apparatus may include: a first data input/output line configured to transfer data; and a precharge circuit configured to precharge the first data input/output line to a first voltage level during a read operation, and to precharge the first data input/output line to either a second voltage level or a third voltage level during a write operation.

BRIEF DESCRIPTION OF THE DRAWINGS

FIGS. 5A and 5B are diagrams of voltage levels illustrating operation of the semiconductor memory apparatus in accordance with an embodiment.

DETAILED DESCRIPTION

Hereinafter, a semiconductor apparatuses will be described below with reference to the accompanying drawings through various examples of embodiments.

One or more examples of embodiments are provided to a precharge circuit capable of effectively changing a level of precharge voltage applied to data input/output lines according to an operation of a semiconductor memory apparatus, and the semiconductor memory apparatus using the same.

Figure 1:
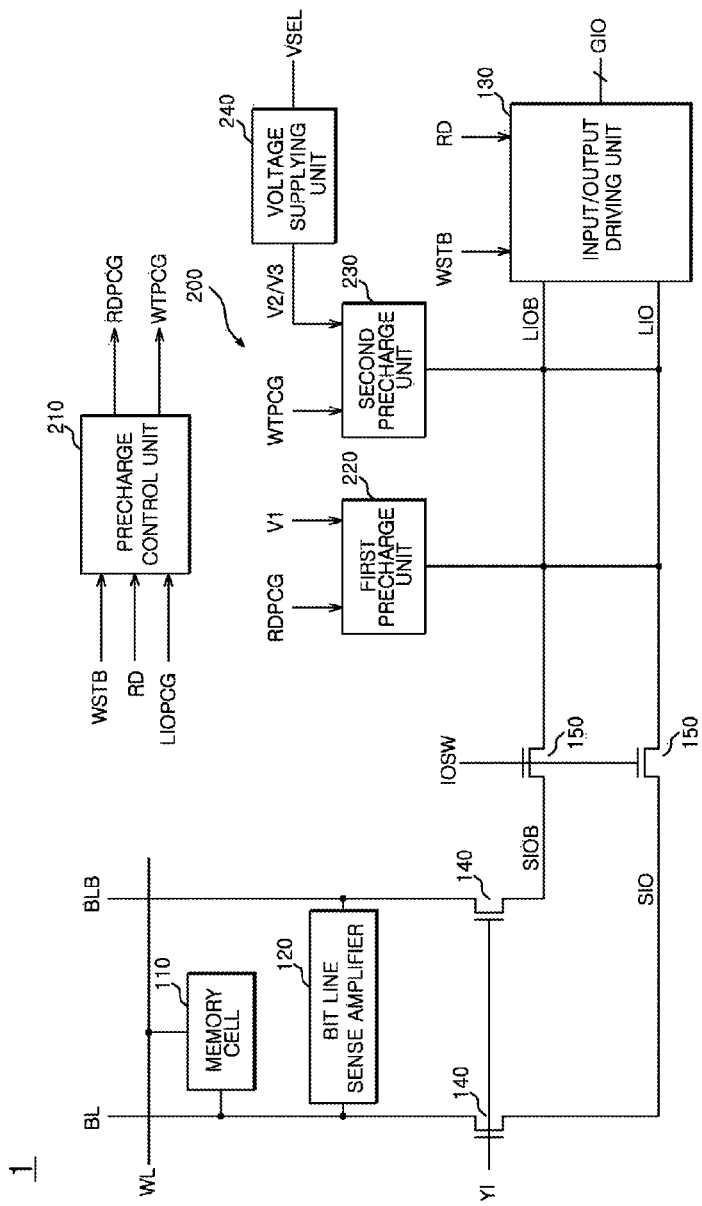
FIG. 1 is a circuit diagram illustrating a semiconductor memory apparatus in accordance with an embodiment.

Referring to FIG. 1, in accordance with an example of an embodiment, the semiconductor memory apparatus 1 may include a memory cell 110, first data input/output lines LIO and LIOB, and a precharge unit 200. The semiconductor memory apparatus 1 may perform data communication with a memory controller or a processor, and the memory cell 110 may store data inputted from the memory controller or the processor. The memory cell 110 may be coupled to a word line WL and a bit line BL, and accessed according to selection of the word line WL and the bit line BL. Even though FIG. 1 shows one memory cell, the semiconductor memory apparatus 1 may include a plurality of memory cells, a plurality of word lines and bit lines, and the plurality of memory cells may be coupled to corresponding ones of the plurality of word lines and bit lines, respectively.

The first data input/output lines LIO and LIOB may transfer data of the semiconductor memory apparatus 1. The first data input/output lines LIO and LIOB may serve as a transmission line for transmitting data, which is inputted from the memory controller or the processor, to the memory cell 110, and transmitting data, which is outputted from the memory cell 110, to the memory controller or the processor.

The precharge unit 200 may precharge the first data input/output lines LIO and LIOB. The precharge unit 200 may precharge the first data input/output lines LIO and LIOB to a level of a first voltage V1 when the semiconductor memory apparatus 1 performs a read operation, and to one of levels of a second voltage V2 and a third voltage V3 when the semiconductor memory apparatus 1 performs a write operation.

According to an example of an embodiment, it may be preferable that the level of the third voltage V3 is lower than the level of the first voltage V1, and the level of the second voltage V2 is lower than the level of the third voltage V3. For example, the first voltage V1 may be a core voltage VCORE, and the second voltage V2 may be a bit line precharge voltage VBLP. The core voltage VCORE may be an internal voltage used in a core area of the semiconductor memory apparatus 1, and may be generated from a power voltage. The bit line precharge voltage VBLP may have a voltage level corresponding to a half of the core voltage VCORE. The third voltage V3 may be lower than the core voltage VCORE and higher than the bit line precharge voltage VBLP. For example, the third voltage V3 may have a voltage level corresponding to an average of the core voltage VCORE and the bit line precharge voltage VBLP.

Referring to FIG. 1, the precharge unit 200 may include a precharge control unit 210, a first precharge unit 220, and a second precharge unit 230. The precharge control unit 210 may generate a read precharge signal RDPCG and the write precharge signal WTPCG in response to a write signal WSTB, a read signal RD, and a precharge signal LIOPCG. The precharge control unit 210 may enable the read precharge signal RDPCG when the precharge signal LIOPCG and the read signal RD are enabled, and enable the write precharge signal WTPCG when the precharge signal LIOPCG and the write signal WSTB are enabled. In the case where the read signal RD and the write signal WSTB are not inputted, the precharge control unit 210 may enable the read precharge signal RDPCG when the precharge signal LIOPCG are enabled, and may disable the read precharge signal RDPCG and the write precharge signal WTPCG when the precharge signal LIOPCG is disabled.

The read signal RD may be an internal signal generated when the semiconductor memory apparatus 1 receives a read command from the memory controller or the processor and performs the read operation. The write signal WSTB may be generated when the semiconductor memory apparatus 1 receives a write command from the memory controller or the processor and performs the write operation. The semiconductor memory apparatus 1 may generate a strobe signal for actually performing the read and write operations when the semiconductor memory apparatus 1 receives the read command and the write command. The precharge signal LIOPCG may be enabled during a time frame when the read operation and the write operation are not performed, that is, when the strobe signal for performing the read operation and the write operation is not generated.

The first precharge unit 220 may be coupled to the first data input/output line LIO and LIOB, and may precharge the first data input/output line LIO and LIOB to the level of the first voltage V1 in response to the read precharge signal RDPCG. The second precharge unit 230 may be coupled to the first data input/output lines LIO and LIOB, and may precharge the first data input/output lines LIO and LIOB to either the second voltage V2 level or the third voltage V3 level in response to the write precharge signal WTPCG. The precharge unit 200 may further include a voltage supplying unit 240 configured to provide one of the second voltage V2 and the third voltage V3 to the second precharge unit 230. The voltage supplying unit 240 may be coupled to an internal power generation circuit, which is configured to generate the second voltage V2 and the third voltage V3, through a power mesh, receive the second voltage V2 and the third voltage V3, and provide one of the second voltage V2 and the third voltage V3 to the second precharge unit 230 in response to a voltage selection signal VSEL. The voltage selection signal VSEL may be a control signal for determining a level of precharge voltage, which is to be applied to the first data input/output line LIO and LIOB, during the write operation according to a product where the semiconductor memory apparatus 1 is implemented.

Referring to FIG. 1, the semiconductor memory apparatus 1 may further include a bit line sense amplifier 120, second data input/output lines SIO and SIOB, a third data input/output line GIO, and an input/output driving unit 130. The bit line sense amplifier 120 may be coupled to a pair of bit lines BL and BLB, and may sense and amplify variation of a voltage level of the pair of bit lines BL and BLB. The second data input/output lines SIO and SIOB may be coupled to the pair of bit lines BL and BLB through a column switch 140. The column switch 140 may couple the pair of bit lines BL and BLB to the second data input/output lines SIO and SIOB, respectively, when the column switch 140 is turned on in response to a column selection signal YI. The column selection signal YI may be generated from a column address signal inputted to select the bit line BL to be accessed. Also, the second data input/output line SIO and SIOB may be coupled to the first data input/output line LIO and LIOB through an input/output switch 150. The input/output switch 150 may couple the second data input/output line SIO and SIOB to the first data input/output line LIO and LIOB when the input/output switch 150 is turned on in response to an input/output switch signal IOSW.

The third data input/output line GIO may be coupled to the first data input/output lines LIO and LIOB through the input/output driving unit 130. The input/output driving unit 130 may amplify data, which is transmitted through the first data input/output lines LIO and LIOB, and output the amplified data to the third data input/output line GIO. Also the input/output driving unit 130 may drive the first data input/output lines LIO and LIOB according to a voltage level of the data, which is transmitted through the third data input/output line GIO. The third data input/output line GIO may be coupled to a data pad, which may be coupled to the memory controller or the processor. Accordingly, during the read operation of the semiconductor memory apparatus 1, data stored in the memory cell 110 may be outputted to the memory controller or the processor sequentially through the bit line BL, the second data input/output lines SIO and SIOB, the first data input/output lines LIO and LIOB, and the third data input/output line GIO. Also, during the write operation of the semiconductor memory apparatus 1, data, which is inputted from the memory controller or the processor, may be stored in the memory cell 110 sequentially through the third data input/output line GIO, the first data input/output lines LIO and LIOB, the second data input/output lines SIO and SIOB, and the bit line BL.

Figure 2:
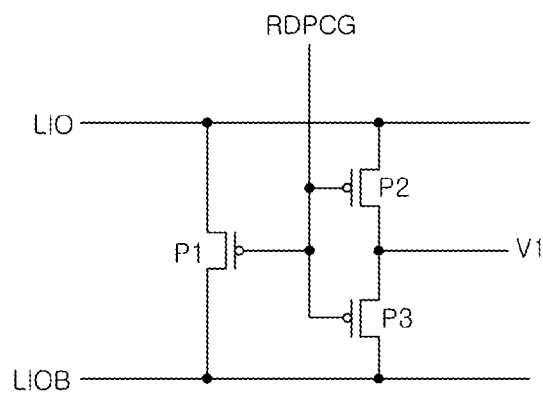
FIG. 2 is a circuit diagram illustrating a first precharge unit shown in FIG. 1.

FIG. 2 is a circuit diagram illustrating the first precharge unit 220 shown in FIG. 1. The first precharge unit 220 may include first to third PMOS transistors P1 to P3. The first PMOS transistor P1 may receive the read precharge signal RDPCG at its gate, and may be coupled to the first data input/output line LIO and LIOB at its source and drain, respectively. The second PMOS transistor P2 may receive the read precharge signal RDPCG at its gate, and the first voltage V1 at one of its source and drain, and may be coupled to the first data input/output line LIO at the other one of its source and drain. The third PMOS transistor P3 may receive the read precharge signal RDPCG at its gate, and the first voltage V1 at one of its source and drain, and may be coupled to the first data input/output line LIOB at the other one of its source and drain. Therefore, the first to third PMOS transistors P1 to P3 of the first precharge unit 220 may precharge the first data input/output line LIO and LIOB to the level of the first voltage V1 when the read precharge signal RDPCG is enabled to a low level.

Figure 3:
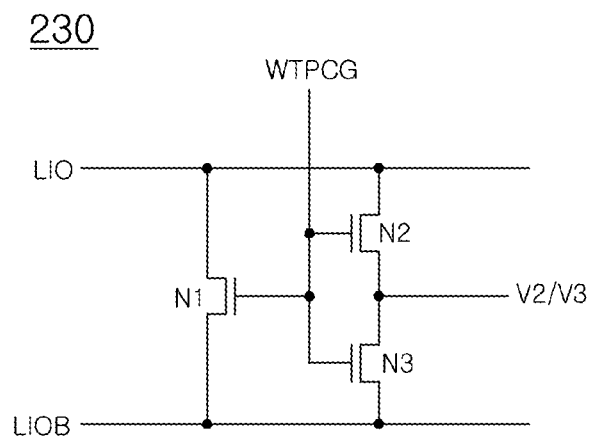
FIG. 3 is a circuit diagram illustrating a second precharge unit shown in FIG. 1.

FIG. 3 is a circuit diagram illustrating the second precharge unit 230 shown in FIG. 1. The second precharge unit 230 may include first to third NMOS transistors N1 to N3. The first NMOS transistor N1 may receive the write precharge signal WTPCG at its gate, and may be coupled to the first data input/output lines LIO and LIOB at its source and drain, respectively. The second NMOS transistor N2 may receive the write precharge signal WTPCG at its gate, and one of the second voltage V2 and the third voltage V3 at one of its source and drain, and may be coupled to the first data input/output line LIO at the other one of its source and drain. The third NMOS transistor N3 may receive the write precharge signal WTPCG at its gate, and one of the second voltage V2 and the third voltage V3 at one of its source and drain, and may be coupled to the first data input/output line LIOB at the other one of its source and drain. Therefore, the first to third NMOS transistors N1 to N3 of the second precharge unit 230 may precharge the first data input/output line LIO and LIOB to the level of one of the second voltage V2 and the third voltage V3 when the write precharge signal WTPCG is enabled to a high level.

Figure 4:
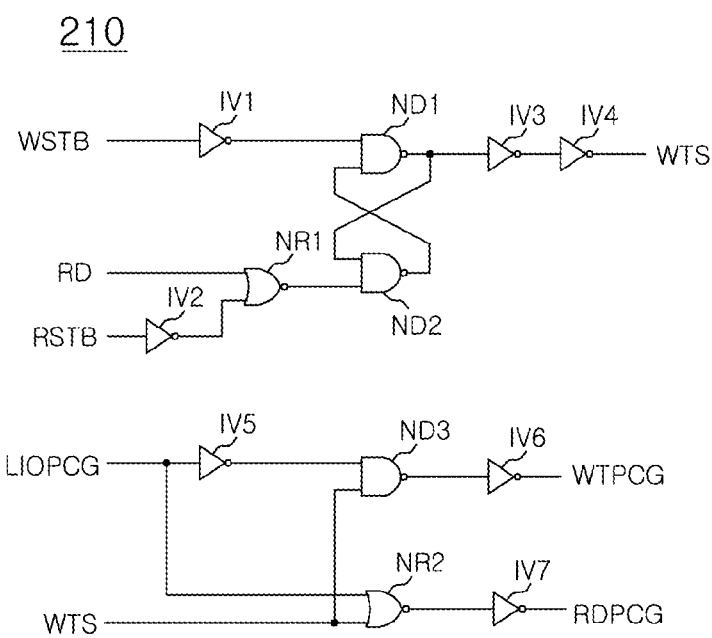
FIG. 4 is a circuit diagram illustrating a precharge control unit shown in FIG. 1.

FIG. 4 is a circuit diagram illustrating the precharge control unit 210 shown in FIG. 1. Referring to FIG. 4, the precharge control unit 210 may include first to seventh inverters IV1 to IV7, first and second NOR gates NR1 and NR2, and first to third NAND gates ND1 to ND3. The first inverter IV1 may invert the write signal WSTB and output an inverted write signal WSTB. The second inverter IV2 may receive a reset signal RSTB for resetting the semiconductor memory apparatus 1. The first NOR gate NR1 may receive the read signal RD and an output of the second inverter IV2. The first NAND gate ND1 may receive an output of the first inverter IV1 and an output of the second NAND gate ND2. The second NAND gate ND2 may receive an output of the first NAND gate ND1 and an output of the first NOR gate NR1. The third and fourth inverters IV3 and IV4 may generate an operation identification signal WTS by sequentially inverting the output of the first NAND gate ND1. The first inverter IV1, the first NOR gate NR1, and the first and second NAND gates ND1 and ND2 together may comprise a SR latch, which may output the operation identification signal WTS having the high level when the write signal WSTB is enabled to the high level, and output the operation identification signal WTS having the low level when the read signal RD is enabled to the high level.

The fifth inverter IV5 may invert the precharge signal LIOPCG and output an inverted precharge signal LIOPCG. The third NAND gate ND3 may receive an output of the fifth inverter IV5 and the operation identification signal WTS. The sixth inverter IV6 may generate the write precharge signal WTPCG by inverting the output of the third NAND gate ND3. The second NOR gate NR2 may receive the precharge signal LIOPCG and the operation identification signal WTS. The seventh inverter IV7 may generate the read precharge signal RDPCG by inverting the output of the second NOR gate NR2. The operation identification signal WTS may maintain a high level until the read signal RD is enabled after the write signal WSTB is enabled. When the operation identification signal WTS has a high level and the precharge signal LIOPCG is enabled to a low level, the write precharge signal WTPCG, which is enabled to a high level, and the read precharge signal RDPCG, which is disabled to a high level, may be generated. When the read signal RD is enabled, and thus the operation identification signal WTS has a low level and the precharge signal LIOPCG is enabled to a low level, the write precharge signal WTPCG, which is disabled to a low level, and the read precharge signal RDPCG, which is enabled to a low level, may be generated. When the precharge signal LIOPCG is disabled to a high level, the write precharge signal WTPCG, which is disabled to a low level, and the read precharge signal RDPCG, which is disabled to the high level, may be generated.

FIGS. 5A and 5B are diagrams of voltage levels illustrating the operation of the semiconductor memory apparatus 1 in accordance with an example of an embodiment. FIG. 5A shows that the first data input/output line LIO is precharged to the level of the second voltage V2 during the write operation (i.e., WRITE). FIG. 5B shows that the first data input/output line LIO is precharged to the level of the third voltage V3 during the write operation. The operation of the semiconductor memory apparatus 1 in accordance with an example of an embodiment will be described as follows with reference to FIGS. 1 to 5B.

When the write command is inputted to the semiconductor memory apparatus 1, the write signal WSTB may be generated, and the precharge control unit 210 may enable the write precharge signal WTPCG and disable the read precharge signal RDPCG. Therefore, the first data input/output line LIO may be precharged to the level of the second voltage V2. When the write operation is performed, the precharge signal LIOPCG may be disabled, and the first data input/output line LIO may be driven by the input/output driving unit 130 according to data, which is transmitted through the third data input/output line GIO. The first data input/output line LIO may be driven to the level of the first voltage V1 when the data transmitted through the third data input/output line GIO has a logic level '1', and the first data input/output line LIO may be driven to the level of the ground voltage VSS when the data transmitted through the third data input/output line GIO has a logic level '0'.

When the write operation is completed, and the read command is inputted to the semiconductor memory apparatus 1, the read signal RD may be generated, and the precharge control unit 210 may disable the write precharge signal WTPCG and enable the read precharge signal RDPCG. Accordingly, the precharge voltage of the first data input/output line LIO may be changed, and the first data input/output line LIO may be precharged to the level of the first voltage V1. When the read operation is performed, the precharge signal LIOPCG may be disabled, and the voltage level of the first data input/output line LIO may be changed according to the level of data, which is transmitted through the second data input/output line SIO. When data of the logic level '0' is transmitted through the second data input/output line SIO, the voltage level of the first data input/output line LIO may be lowered by the amount of ΔV from the first voltage V1. When data of the logic level '1' is transmitted through the second data input/output line SIO, the voltage level of the first data input/output line LIO may be kept to the first voltage V1. The input/output driving unit 130 may sense the variation of the voltage level of the first data input/output line LIO, and output corresponding data to the third data input/output line GIO. When the read operation is completed, the first data input/output line LIO may be precharged again to the level of the first voltage V1.

As described above, when the semiconductor memory apparatus 1 performs the write operation, the precharge unit 200 may precharge the first data input/output lines LIO and LIOB to the level of the second voltage V2, and therefore may reduce current consumption for the input/output driving unit 130 to drive the first data input/output line LIO and LIOB according to data. Also, when the semiconductor memory apparatus 1 performs the read operation, the precharge unit 200 may precharge the first data input/output lines LIO and LIOB to the level of the first voltage V1, and therefore the input/output driving unit 130 may accurately sense the variation of the voltage level of the first data input/output lines LIO and LIOB, which may change according to the voltage level of the data.

The semiconductor memory apparatus 1 may alternatively perform the write operation and the read operation, and, in general, each of the operations may be performed in given time. The given time may be short and therefore may not be sufficient for precharging the first data input/output line LIO and LIOB, which has been precharged to the level of the second voltage V2 during the write operation, to the level of the first voltage V1 for the read operation. Accordingly, the precharge unit 200 may precharge the first data input/output line LIO and LIOB to the level of the third voltage V3 during the write operation. As shown in FIG. 5B, the first data input/output line LIO may be precharged to the level of the third voltage V3 during the write operation. Therefore, a time for changing the level of the precharge voltage may be reduced, and the semiconductor memory apparatus 1 may alternatively perform the write operation and the read operation with smoothness and accuracy even though current consumption may not be reduced as much as the embodiments described with reference to FIG. 5A when the first data input/output line LIO is driven to the level of the ground voltage VSS during the write operation.

Figure 6:
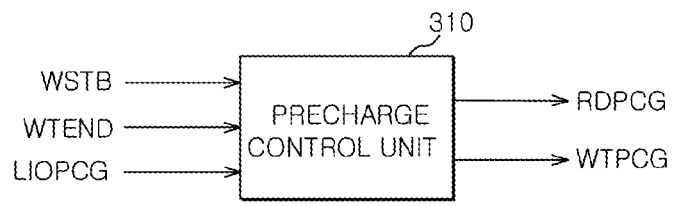
FIG. 6 is a block diagram illustrating a precharge control unit in accordance with an embodiment.
Figure 7:
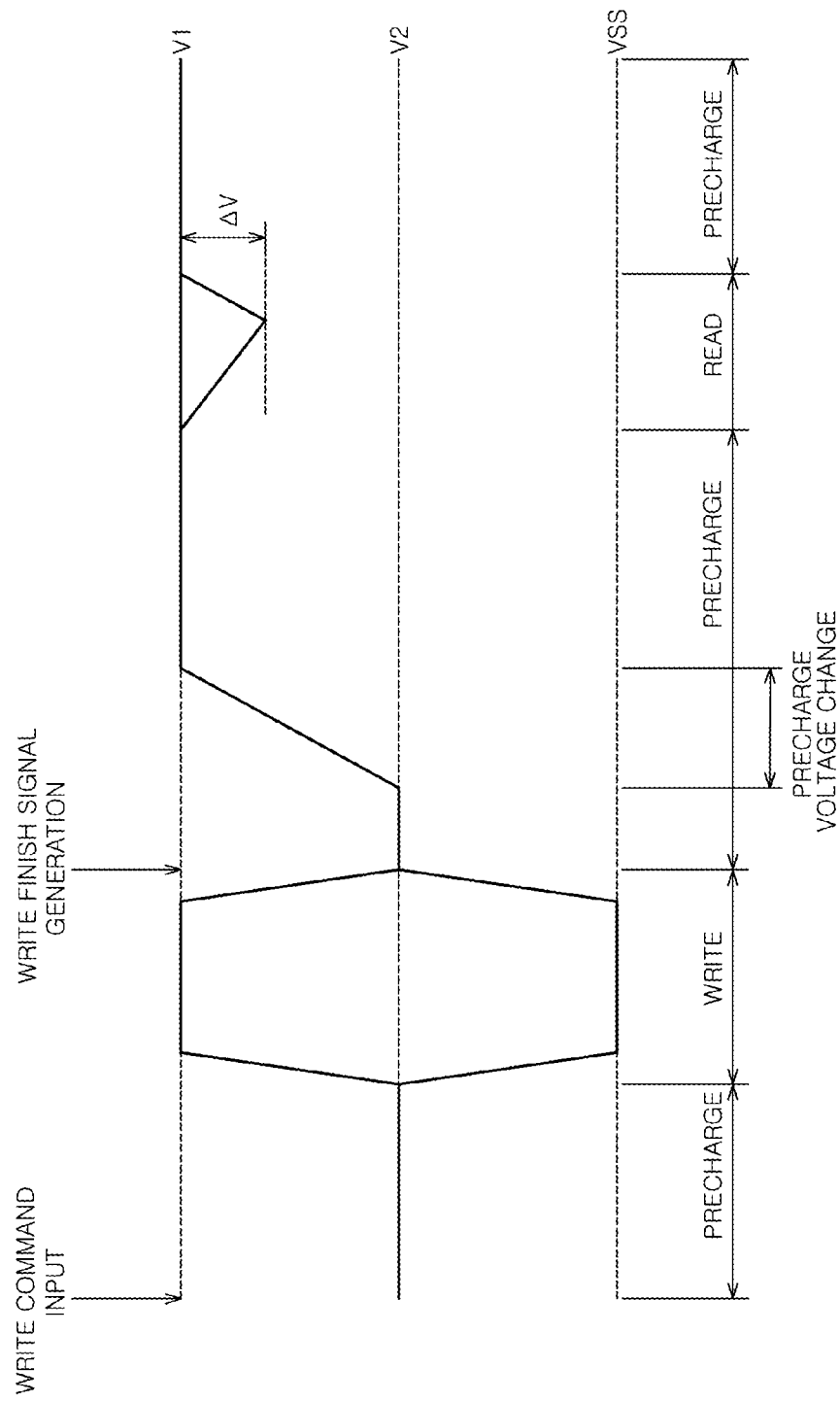
FIG. 7 is diagram of a voltage level illustrating operation of the semiconductor memory apparatus including the precharge control unit shown in FIG. 6.

FIG. 6 is a block diagram illustrating the precharge control unit 310 in accordance with an example of an embodiment, and FIG. 7 is diagram of a voltage level illustrating an operation of the semiconductor memory apparatus including the precharge control unit 310 shown in FIG. 6. Referring to FIG. 6, the precharge control unit 310 may generate the read precharge signal RDPCG and the write precharge signal WTPCG in response to the write signal WSTB, a write end signal WTEND and the precharge signal LIOPCG. The write end signal WTEND may be generate right after the write operation is completed. The precharge control unit 310 may have substantially the same composition as the precharge control unit 210 described above with reference to FIG. 4 except that the write end signal WTEND is replaced for the read signal RD.

The precharge control unit 310 may enable the write precharge signal WTPCG when the precharge signal LIOPCG and the write signal WSTB are enabled, and enable the read precharge signal RDPCG when the precharge signal LIOPCG and the write end signal WTEND are enabled. Even though the read command is not inputted to the semiconductor memory apparatus 1, as shown in FIG. 7, the precharge control unit 310 may precharge the first data input/output line LIO to the level of the first voltage V1 by promptly enabling the read precharge signal RDPCG in response to the write end signal WTEND when the write operation of the semiconductor memory apparatus 1 is completed. Therefore, after the write operation is completed, the first data input/output line LIO may be promptly precharged to the level of the first voltage V1 before the next read operation begins.

Figure 8:
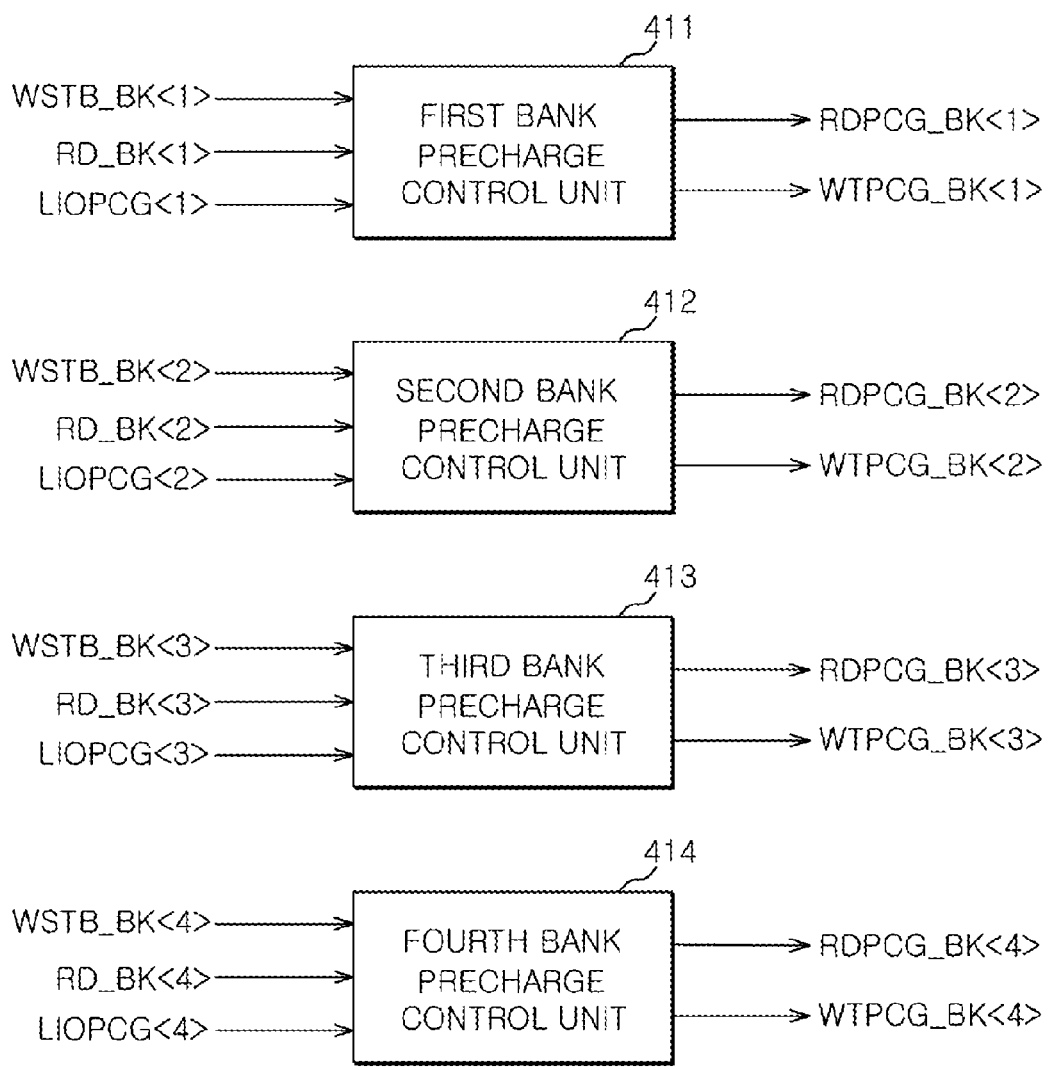
FIG. 8 is a block diagram illustrating a precharge control unit in accordance with an embodiment.

FIG. 8 is a block diagram illustrating a precharge control unit 410 in accordance with an example of an embodiment. The semiconductor memory apparatus 1 may include the plurality of memory cells, which are disposed in a core area, and the core area may comprise memory banks. That is, the semiconductor memory apparatus 1 may include a plurality of memory banks, and the read operation and the write operation may be independently performed in each of the plurality of memory banks. FIG. 8 shows the precharge control unit 410 applicable to the semiconductor memory apparatus 1 when the semiconductor memory apparatus 1 includes four memory banks. The precharge control unit 410 may include first to fourth bank precharge control units 411 to 414. In order to precharge a first data input/output line coupled to the first memory back, the first bank precharge control unit 411 may receive a write signal WSTB_BK<1>, a read signal RD_BK<1>, and a precharge signal LIOPCG_BK<1>, which are related to the first memory bank, and may generate a first bank read precharge signal RDPCG_BK<1> and a first bank write precharge signal WTPCG_BK<1>. Similarly, in order to precharge first data input/output lines respectively coupled to the second to fourth memory backs, the second to fourth bank precharge control units 412 to 414 may receive write signals WSTB_BK<2:4>, read signal RD_BK<2:4>, and precharge signals LIOPCG_BK<2:4>, which are respectively related to the second to fourth memory bank, and may generate first bank read precharge signals RDPCG_BK<2:4> and first bank write precharge signals WTPCG_BK<2:4>, respectively. The precharge control unit 410 may set independently each of voltage levels of precharge of the first data input/output lines coupled to the plurality of memory banks included in the semiconductor memory apparatus 1, and therefore may reduce current consumption for the operations of the semiconductor memory apparatus.

Above embodiments show the precharge unit applied to the first data input/output line in the description, and a precharge unit in accordance with an embodiment may be further applied to the second and third data input/output lines without departing from the scope of the embodiments.

Figure 9:
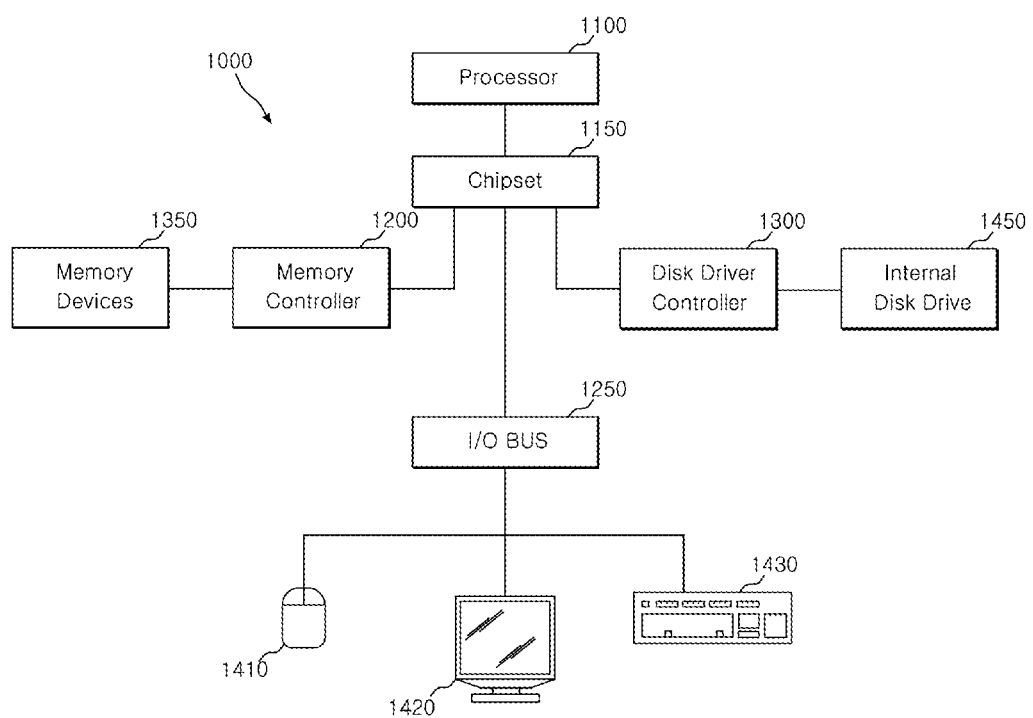
FIG. 9 illustrates a block diagram of a system employing the semiconductor memory apparatus in accordance with the embodiments discussed above with relation to FIGS. 1-8.

The semiconductor memory apparatus discussed above is particular useful in the design of memory devices, processors, and computer systems. For example, referring to FIG. 9, a block diagram of a system employing the semiconductor memory apparatus in accordance with the embodiments are illustrated and generally designated by a reference numeral 1000. The system 1000 may include one or more processors or central processing units ("CPUs") 1100. The CPU 1100 may be used individually or in combination with other CPUs. While the CPU 1100 will be referred to primarily in the singular, it will be understood by those skilled in the art that a system with any number of physical or logical CPUs may be implemented.

A chipset 1150 may be operably coupled to the CPU 1100. The chipset 1150 is a communication pathway for signals between the CPU 1100 and other components of the system 1000, which may include a memory controller 1200, an input/output ("I/O") bus 1250, and a disk drive controller 1300. Depending on the configuration of the system, any one of a number of different signals may be transmitted through the chipset 1150, and those skilled in the art will appreciate that the routing of the signals throughout the system 1000 can be readily adjusted without changing the underlying nature of the system.

As stated above, the memory controller 1200 may be operably coupled to the chipset 1150. The memory controller 1200 may include at least one semiconductor memory apparatus as discussed above with reference to FIGS. 1-8. Thus, the memory controller 1200 can receive a request provided from the CPU 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the semiconductor memory apparatus as discussed above with relation to FIGS. 1-8, the memory devices 1350 may include a plurality of word lines and a plurality of bit lines for defining a plurality of memory cell. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420, and 1430. Further, the I/O bus 1250 may be integrated into the chipset 1150.

The disk drive controller 1450 (i.e., internal disk drive) may also be operably coupled to the chipset 1150. The disk drive controller 1450 may serve as the communication pathway between the chipset 1150 and one or more internal disk drives 1450. The internal disk drive 1450 may facilitate disconnection of the external data storage devices by storing both instructions and data. The disk drive controller 1300 and the internal disk drives 1450 may communicate with each other or with the chipset 1150 using virtually any type of communication protocol, including all of those mentioned above with regard to the I/O bus 1250.

It is important to note that the system 1000 described above in relation to FIG. 9 is merely one example of a system employing the semiconductor memory apparatus as discussed above with relation to FIGS. 1-8. In alternate embodiments, such as cellular phones or digital cameras, the components may differ from the embodiments shown in FIG. 9.

While various embodiments have been described above, it will be understood to those skilled in the art that the embodiments described are by way of example only. Accordingly, the precharge circuit of the memory apparatus should not be limited based on the described embodiments. Rather, the precharge circuit of the memory apparatus described herein should only be limited in light of the claims that follow when taken in conjunction with the above description and accompanying drawings.

What is claimed is:

1. A precharge circuit comprising:
   a precharge control unit configured to generate a read precharge signal and a write precharge signal in response to a read signal, a write signal, and a precharge signal;
   a first precharge unit configured to precharge a data input/output line to a first voltage level in response to the read precharge signal; and
   a second precharge unit configured to precharge the data input/output line to either a second voltage level or a third voltage level in response to the write precharge signal,
   wherein the second voltage level is lower than the third voltage level, and the third voltage level is lower than the first voltage level,
   wherein the second voltage level corresponds to a half of the first voltage level.

2. The precharge circuit of claim 1, wherein the precharge control unit enables the read precharge signal when the read signal and the precharge signal are enabled, and enables the write precharge signal when the write signal and the precharge signal are enabled.

3. The precharge circuit of claim 1, wherein the precharge control unit enables the read precharge signal when the precharge signal is enabled, and disables the read precharge signal and the write precharge signal when the precharge signal is disabled.

4. A precharge circuit comprising:
   a precharge control unit configured to generate a read precharge signal and a write precharge signal in response to a write signal, a write end signal, and a precharge signal;
   a first precharge unit configured to precharge a data input/output line to a first voltage level in response to the read precharge signal; and
   a second precharge unit configured to precharge the data input/output line to either a second voltage level or a third voltage level in response to the write precharge signal,
   wherein the second voltage level is lower than the third voltage level, and the third voltage level is lower than the first voltage level,
   wherein the second voltage level corresponds to a half of the first voltage level.

5. The precharge circuit of claim 4, wherein the precharge control unit enables the read precharge signal when the write end signal and the precharge signal are enabled, and enables the write precharge signal when the write signal and the precharge signal are enabled.

6. The precharge circuit of claim 4, wherein the precharge control unit enables the read precharge signal when the precharge signal is enabled, and disables the read precharge signal and the write precharge signal when the precharge signal is disabled.

7. A semiconductor memory apparatus comprising:
   a first data input/output line configured to transfer data; and
   a precharge circuit configured to precharge the first data input/output line to a first voltage level during a read operation, and to precharge the first data input/output line to either a second voltage level or a third voltage level during a write operation,
   wherein the second voltage level is lower than the third voltage level, and the third voltage level is lower than the first voltage level,
   wherein the second voltage level corresponds to a half of the first voltage level.

8. The semiconductor memory apparatus of claim 7, wherein the precharge circuit comprises:
   a precharge control unit configured to generate a read precharge signal and a write precharge signal in response to a write signal and a precharge signal;
   a first precharge unit configured to precharge the first data input/output line to the first voltage level in response to the read precharge signal; and
   a second precharge unit configured to precharge the first data input/output line to either the second voltage level or the third voltage level in response to the write precharge signal.

9. The semiconductor memory apparatus of claim 8, wherein the precharge control unit generates the read precharge signal and the write precharge signal in response to the write signal, the precharge signal, and a read signal.

10. The semiconductor memory apparatus of claim 8, wherein the precharge control unit generates the read precharge signal and the write precharge signal in response to the write signal, the precharge signal, and a write end signal.

11. The semiconductor memory apparatus of claim 9, wherein the precharge control unit enables the read precharge signal when the read signal and the precharge signal are enabled, and enables the write precharge signal when the write signal and the precharge signal are enabled.

12. The semiconductor memory apparatus of claim 9, wherein the precharge control unit enables the read precharge signal when the precharge signal is enabled, and disables the read precharge signal and the write precharge signal when the precharge signal is disabled.

13. The semiconductor memory apparatus of claim 7, further comprising a voltage supplying unit configured to provide one of the second and third voltages to the precharge circuit in response to a voltage selection signal.

14. The semiconductor memory apparatus of claim 7, wherein the first data input/output line is coupled to a second data input/output line through an input/output switch, which is configured to receive an input/output switch signal, and the second data input/output line is coupled to a bit line and a memory cell through a column switch, which configured to receive a column selection signal.

15. The semiconductor memory apparatus of claim 7, wherein the first data input/output line is coupled to a third data input/output line through an input/output driving unit.

16. The semiconductor memory apparatus of claim 15, wherein the input/output driving unit drives the first data input/output line according to a voltage level of a data, which is transmitted through the third data input/output line, during the write operation, and outputs data, which is generated by sensing variation of a voltage level of the first data input/output line, to the third data input/output line during the read operation.

* * * * *